United States Patent
Bhagavat et al.

(10) Patent No.: US 10,867,978 B2
(45) Date of Patent: Dec. 15, 2020

(54) INTEGRATED CIRCUIT MODULE WITH INTEGRATED DISCRETE DEVICES

(71) Applicant: Advanced Micro Devices, Inc., Santa Clara, CA (US)

(72) Inventors: Milind S. Bhagavat, Cupertino, CA (US); Rahul Agarwal, San Francisco, CA (US)

(73) Assignee: Advanced Micro Devices, Inc., Santa Clara, CA (US)

( * ) Notice: Subject to any disclaimer, the term of this patent is extended or adjusted under 35 U.S.C. 154(b) by 0 days.

(21) Appl. No.: 16/215,969

(22) Filed: Dec. 11, 2018

(65) Prior Publication Data
US 2020/0185367 A1   Jun. 11, 2020

(51) Int. Cl.
| H01L 25/16 | (2006.01) |
| H01L 23/498 | (2006.01) |
| H01L 23/31 | (2006.01) |
| H01L 21/56 | (2006.01) |
| H01L 49/02 | (2006.01) |
| H01L 21/48 | (2006.01) |

(52) U.S. Cl.
CPC ............ *H01L 25/16* (2013.01); *H01L 21/486* (2013.01); *H01L 21/4853* (2013.01); *H01L 21/568* (2013.01); *H01L 23/3121* (2013.01); *H01L 23/3142* (2013.01); *H01L 23/49811* (2013.01); *H01L 23/49827* (2013.01); *H01L 28/40* (2013.01)

(58) Field of Classification Search
CPC combination set(s) only.
See application file for complete search history.

(56) References Cited

U.S. PATENT DOCUMENTS

| 9,735,778 B1* | 8/2017 | Schulz ................. G06F 1/3206 |
| 10,267,990 B1* | 4/2019 | Yu ........................... G02B 6/136 |
| 10,510,721 B2 | 12/2019 | Bhagavat et al. |
| 2011/0042795 A1* | 2/2011 | Knickerbocker ..... H01L 21/486 257/686 |
| 2016/0260684 A1* | 9/2016 | Zhai .................... H01L 25/0652 |

(Continued)

OTHER PUBLICATIONS

Gilled, K., et al., "Molded Underfill for Flip Chip in Package," HDI, Jun. 2000, 3 pages.

(Continued)

*Primary Examiner* — Nduka E Ojeh
(74) *Attorney, Agent, or Firm* — Zagorin Cave LLP

(57) ABSTRACT

In at least one embodiment, an integrated circuit product includes a redistribution layer, an integrated circuit die disposed above the redistribution layer, and a discrete device disposed laterally with respect to the integrated circuit die and disposed above the redistribution layer. The integrated circuit product may include encapsulant mechanically coupling the redistribution layer, the integrated circuit die, and the discrete device. The integrated circuit product may include first conductive vias through the redistribution layer and second conductive vias through the redistribution layer. The first conductive vias may be electrically coupled to the integrated circuit die and the second conductive vias being electrically coupled to the discrete device. The discrete device may include a discrete capacitor device made from a ceramic material, electrolytic materials, or electrochemical materials.

20 Claims, 10 Drawing Sheets

(56) References Cited

U.S. PATENT DOCUMENTS

2016/0276325 A1\* 9/2016 Nair ..................... H01L 25/105
2019/0008046 A1\* 1/2019 Aleksov ............ H01L 23/49822
2019/0089461 A1\* 3/2019 Sun ..................... H01S 5/4087

OTHER PUBLICATIONS

Lapedus, M., "Challenges for Future Fan-Outs," Semiconductor Engineering, 2017, 15 pages.
Lau, J., et al., "Redistribution Layers (RDLs) for 2.5D/3D IC Integration," Journal of Microelectronics and Electronic Packaging (2014) 11, pp. 16-24.

\* cited by examiner

INTEGRATED CIRCUIT MODULE WITH INTEGRATED DISCRETE DEVICES

BACKGROUND

Description of the Related Art

A typical integrated circuit product includes one or more integrated circuit die and discrete devices, which are not manufacturable by integrated circuit manufacturing techniques. For example, discrete capacitors that provide decoupling capacitance to a power distribution network and have capacitances in the range of micro-Farads are impractical to implement using integrated circuit techniques. Packaged integrated circuit products include those discrete capacitors attached to a package substrate in regions surrounding integrated circuit modules (e.g., 2D, 2.5D or 3D integrated circuits). Incorporating those discrete devices into the packaged integrated circuit product increases package size, which increases cost. In addition, the placement of the discrete capacitors on a package substrate is relatively far from corresponding integrated circuits (e.g., tens of millimeters away), which limits the efficiency of the decoupling. Accordingly, improved techniques for including discrete devices in integrated circuit products are desired.

SUMMARY OF EMBODIMENTS OF THE INVENTION

In at least one embodiment, an integrated circuit product includes a redistribution layer, an integrated circuit die disposed above the redistribution layer, and a discrete device disposed laterally with respect to the integrated circuit die and disposed above the redistribution layer. The integrated circuit product may include encapsulant mechanically coupling the redistribution layer, the integrated circuit die, and the discrete device. The integrated circuit product may include first conductive vias through the redistribution layer and second conductive vias through the redistribution layer. The first conductive vias may be electrically coupled to the integrated circuit die and the second conductive vias may be electrically coupled to the discrete device. The integrated circuit product may include first conductive pillars electrically coupled to the first conductive vias and disposed beneath the redistribution layer. The integrated circuit product may include second conductive pillars electrically coupled to the second conductive vias and disposed beneath the redistribution layer. The integrated circuit product may include third conductive pillars electrically coupled to third conductive vias and disposed beneath the redistribution layer. The integrated circuit product may include a second integrated circuit die disposed above the redistribution layer and laterally with respect to the integrated circuit die and the discrete device, additional conductive vias through the redistribution layer, and a communications integrated circuit die disposed beneath the redistribution layer. The communications integrated circuit die may be electrically coupled to the integrated circuit die and the second integrated circuit die using the additional conductive vias. The discrete device may include a discrete capacitor device made from a ceramic material.

In at least one embodiment, a method for manufacturing an integrated circuit module includes forming a redistribution layer using a substrate, placing an integrated circuit die on the redistribution layer, and placing a discrete device on the redistribution layer. The discrete device is disposed laterally with respect to the integrated circuit die. The method includes encapsulating the integrated circuit die and the discrete device with the redistribution layer. The method may include forming first conductive vias through the redistribution layer and forming second conductive vias through the redistribution layer. The integrated circuit die may be placed to cause the first conductive vias to be electrically coupled to the integrated circuit die and the discrete device may be placed to cause the second conductive vias to be electrically coupled to the discrete device. The method may include forming first conductive pillars using the substrate, forming second conductive pillars using the substrate, and forming third conductive pillars using the substrate. The redistribution layer may be formed above the first conductive pillars, the second conductive pillars, and the third conductive pillars. The method may include placing a communications integrated circuit die on the substrate. The communications integrated circuit die may be disposed laterally from the first conductive pillars, the second conductive pillars, and the third conductive pillars. The method may include forming conductors coupled to the communications integrated circuit die and encapsulating the communications integrated circuit die, the first conductive pillars, the second conductive pillars, the third conductive pillars, and the conductors. The redistribution layer may be disposed above the communications integrated circuit die, the first conductive pillars, the second conductive pillars, the third conductive pillars, and the conductors.

In at least one embodiment, a packaged integrated circuit includes a substrate, a discrete device disposed above the substrate, an integrated circuit die disposed above the substrate and laterally with respect to the discrete device, and encapsulant mechanically coupling the integrated circuit die and the discrete device.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DETAILED DESCRIPTION

Figure 1:
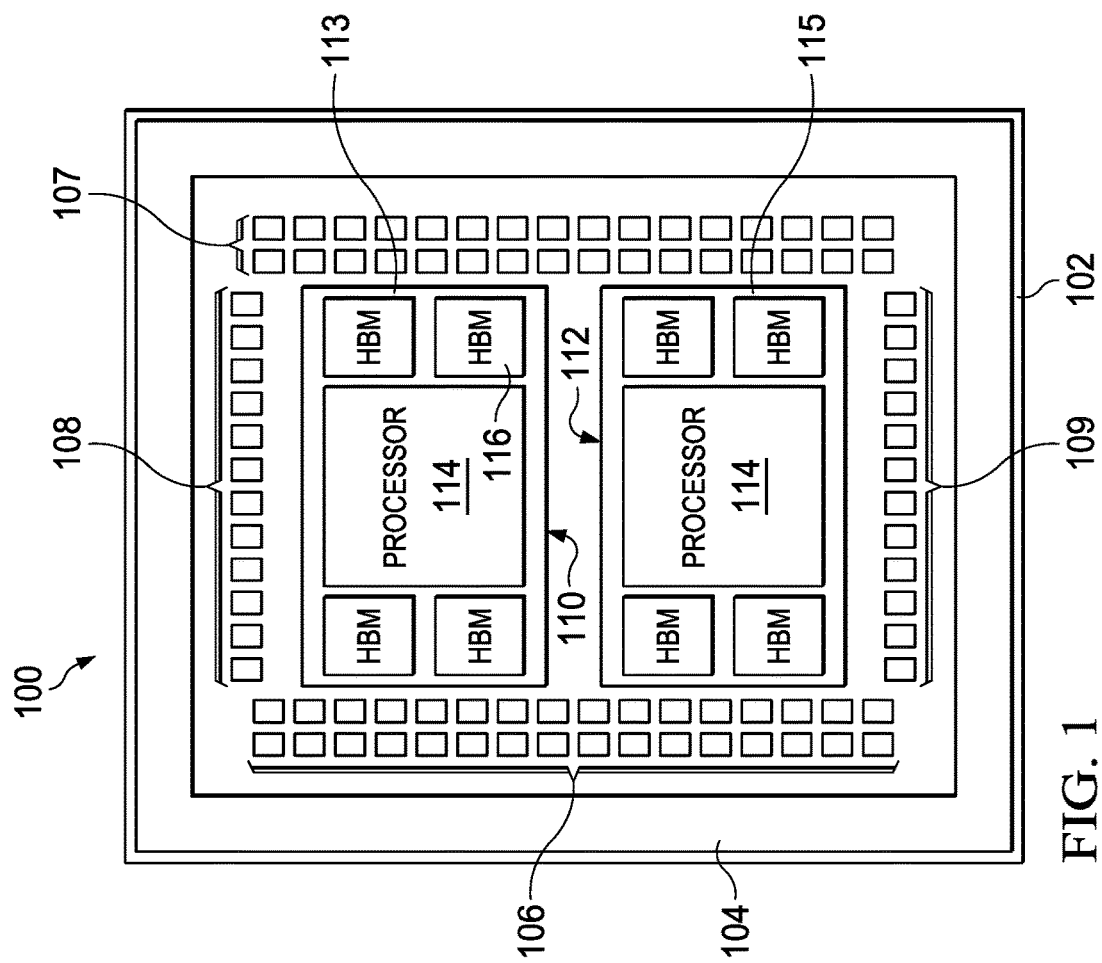
FIG. 1 illustrates a plan view of an exemplary multichip module.

Referring to FIG. 1, multichip module 100 includes package substrate 102 that provides electrical connections and mechanical support for an electronics system including 2.5D integrated circuit 110 and 2.5D integrated circuit 112, each including a processor die (e.g., graphics processing integrated circuit die, central processing integrated circuit die, digital signal processing integrated circuit die, or other processing integrated circuit die) and four memory die (e.g., high-bandwidth memory integrated circuit die) on a silicon interposer. Stiffener ring 104 inhibits warpage of package substrate 102. In an exemplary embodiment, multichip module 100 includes rows of capacitor devices surrounding 2.5D integrated circuit 110 and 2.5D integrated circuit 112 in a rectangular configuration (e.g., horizontal row of discrete devices 108, horizontal row of discrete devices 109, vertical row of discrete devices 106, and vertical row of discrete devices 107). Those discrete devices are surface-mounted to package substrate 102. As referred to herein, a discrete device (or discrete component) is an electronic component with just one circuit element (e.g., resistor, capacitor, inductor, diode). Exemplary discrete capacitors may be ceramic capacitors, film capacitors, etc. In at least one embodiment, horizontal row of discrete devices 108, horizontal row of discrete devices 109, vertical row of discrete devices 106, and vertical row of discrete devices 107 provide decoupling capacitance to a power distribution network using discrete multi-layer ceramic capacitors each having a capacitance in the range of from pF to µF.

2.5D integrated circuit 110 and 2.5D integrated circuit 112 include a silicon interposer 113 and silicon interposer 115, respectively, that electrically couples a graphics processing unit die to four high-bandwidth memory die. Interposers 113 and 115 provide conduits for electrical signals between integrated circuit die and are typically used in packaging configurations that include multiple integrated circuit die in the same package (e.g., 2.5D or 3D integrated circuits). Exemplary interposers are formed from silicon or organic materials and provide larger channels for electrical signals than other technologies (e.g., wire bonding). The larger channels reduce power consumption and RC delay of the integrated circuit system. Integrated circuit die are laid out laterally on silicon interposer 113 of 2.5D integrated circuit 110. Integrated circuit die are laid out laterally on silicon interposer 115 of 2.5D integrated circuit 112. Silicon interposers 113 and 115 supply the electrical connections between integrated circuit die on a corresponding silicon interposer. Silicon interposers 113 and 115 use through-silicon vias (TSVs) for transmission of signals between the integrated circuit die on the corresponding silicon interposer and the package substrate.

Figure 2:
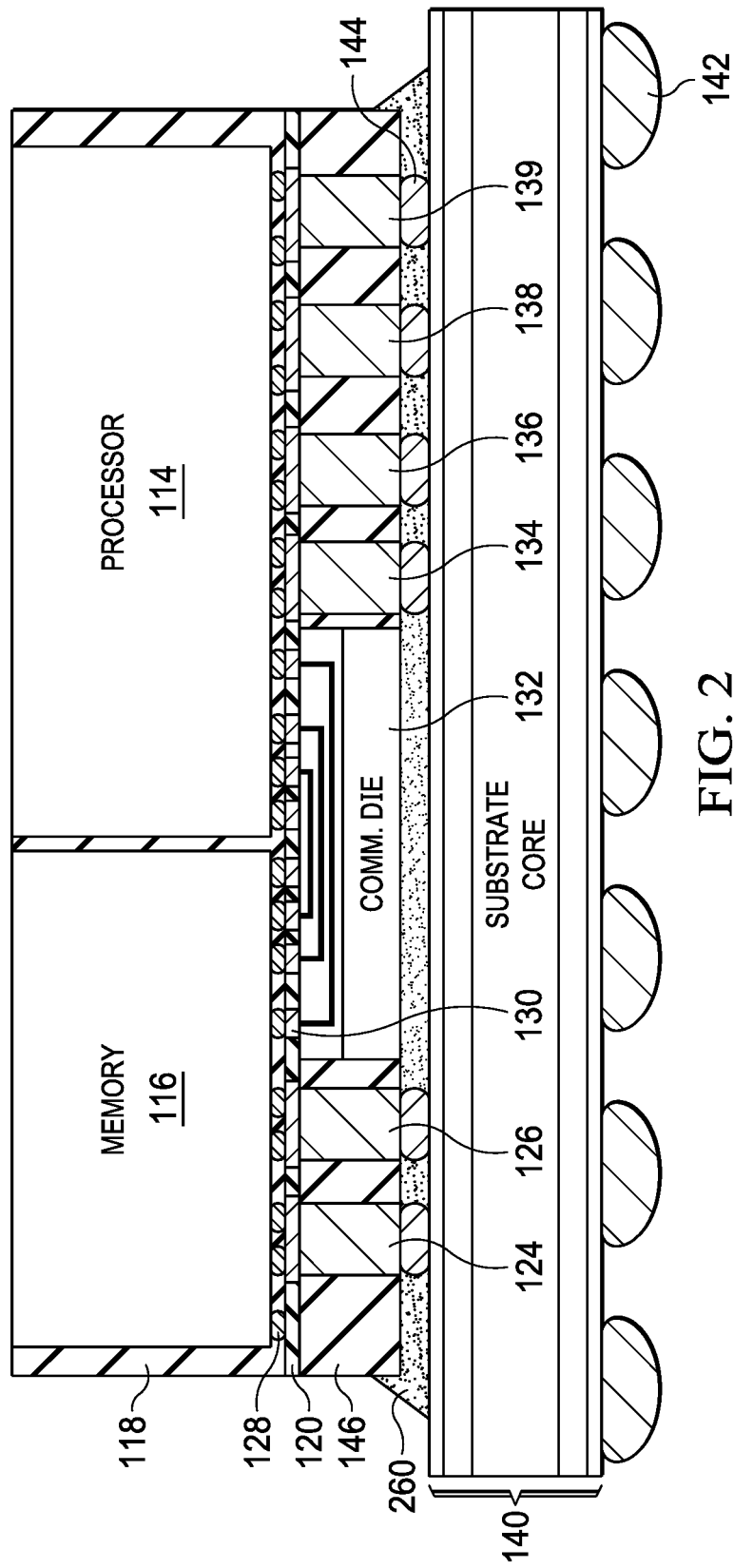
FIG. 2 illustrates a cross-sectional view of an exemplary packaged multichip module including a communications integrated circuit.

Referring to FIG. 2, rather than using an interposer to form a 2.5D integrated circuit, an exemplary 3D integrated circuit manufacturing technique stacks another integrated circuit die vertically, e.g., between the package substrate and the integrated circuit die that are laid out laterally (e.g., communications die 132 is disposed between package substrate 140 and memory die 116 and processor die 114, which are disposed side-by-side). Processor die 114 and memory die 116 are disposed above redistribution layer 120 and are coupled to exposed electrical contacts (e.g., conductor 130) in redistribution layer 120 by conductive bumps 128. Communications die 132 is disposed below redistribution layer 120, between redistribution layer 120 and package substrate 140. Redistribution layer 120 and communications die 132 provide the die-to-die connections (e.g., control and data signals using one or more conductor 130) between processor die 114 and memory die 116. Processor die 114 and memory die 116 have separate electrical connections to the power distribution network in package substrate 140 provided by conductors in redistribution layer 120 and conductive pillars 124, 126, 134, and 136, which surround communications die 132. In at least one embodiment, package substrate 140 is a multi-layer substrate including a top layer, bottom layer, and substrate core.

Redistribution layer 120 includes one or more layers that are typically used to interface an integrated circuit to a package or for making I/O terminals of an integrated circuit available in other locations, to enable bond out in different locations in a chip to facilitate chip-to-chip bonding. Exemplary redistribution materials include copper, copper-damascene, polyimide, or other conductive material surrounded by isolating materials. Redistribution layer 120 is relatively thick for a redistribution layer that is typically thicker than other layers formed on an integrated circuit die (e.g., greater than 1 µm and often 10 µm or thicker). The conductive traces surrounded by insulating material of a redistribution layer are formed by patterning and lithography techniques. In at least one embodiment, redistribution layer 120 is formed using outsourced semiconductor assembly and test techniques for wafer-level chip scale packaging, embedded wafer-level ball grid array packaging, or redistribution chip packaging. Outsourced semiconductor assembly and test techniques use polymers (e.g., polyimide (PI), bensocyclobutene (BCB) cyclotene, polybenzo-bisoxazole (PBO)) to form a passivation layer and use electroplating (e.g., Cu) to form conductive layers. In other embodiments, redistribution layer 120 is formed using a Cu damascene technique, which is a modified version of conventional back-end-of-line techniques.

In at least one embodiment, processor die 114 and memory die 116 are at least partially surrounded by encapsulant 118, e.g., surrounded on sides but include exposed top surfaces of processor die 114 and memory die 116 for heat dissipation purposes. In some embodiments processor die 114 and memory die 116 are at least partially surrounded by underfill material. Exemplary encapsulants include underfill material, mold compound material, or combination thereof. In general, an encapsulant fills gaps between an integrated circuit die and substrate to protect interconnect structures and bare die face. It mechanically locks dissimilar materials together to reduce or eliminate differential in-plane movement so that interfaces move in harmony with joint integrity preserved. An exemplary encapsulant has a suitable viscosity at an applicable application temperature that is lower than the melting point of any conductive structures present at the time of encapsulation. For example, exemplary mold compound is applied using a compression molding process at a molding temperature of approximately 165° C. for approximately 60-120 minutes. Exemplary materials include Nagase liquid materials for compression molding that are dispensed on a wafer or integrated circuit die and compressed to evenly distribute across the wafer or integrated circuit die. In some embodiments, underfill material is used to alleviate effects of mismatched coefficients of thermal expansion and is positioned between the encapsulant and an upper surface of the redistribution layer. Exemplary underfill materials include epoxy materials or other polymers (e.g., capillary flow underfill material that is dispensed at one or two edges of the integrated circuit die and flows under the integrated circuit die using capillary forces). In some embodiments, molded material is used as an underfill material and as an encapsulant. In at least one embodiment, processor die 114 and memory die 116 are encapsulated by compression molding using a suitable compound followed by grinding to expose top surfaces.

In at least one embodiment, conductive pillars 124, 126, 134, 136, 138, and 139 provide conductive paths to power I/O and structural support for graphics processor die 114 and memory die 116 and surround a cavity in which communications die 132 is located. Conductive pillars 124, 126, 134, 136, 138, and 139, redistribution layer 120, and communications die 132 are at least partially surrounded by encapsulant 146 that mechanically couples together those structures. In some embodiments, the encapsulant includes underfill material, mold compound material, or combination thereof. Conductive bumps 144 couple the copper pillars to exposed conductors of package substrate 140. Those exposed conductors couple the copper pillars to conductive bumps 142.

Figure 3:
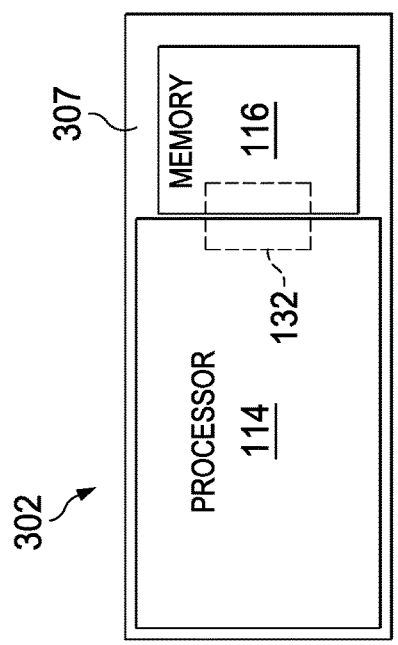
FIG. 3 illustrates a plan view of an exemplary multichip module including integrated circuit die having different geometries.
Figure 4:
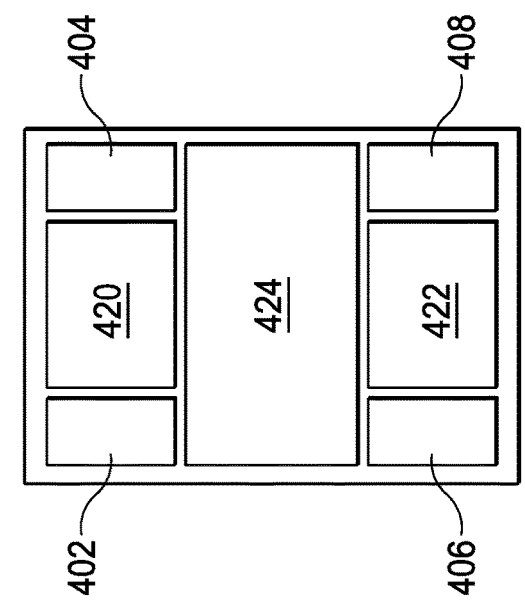
FIG. 4 illustrates a plan view of an exemplary multichip module including a dummy die.
Figure 5:
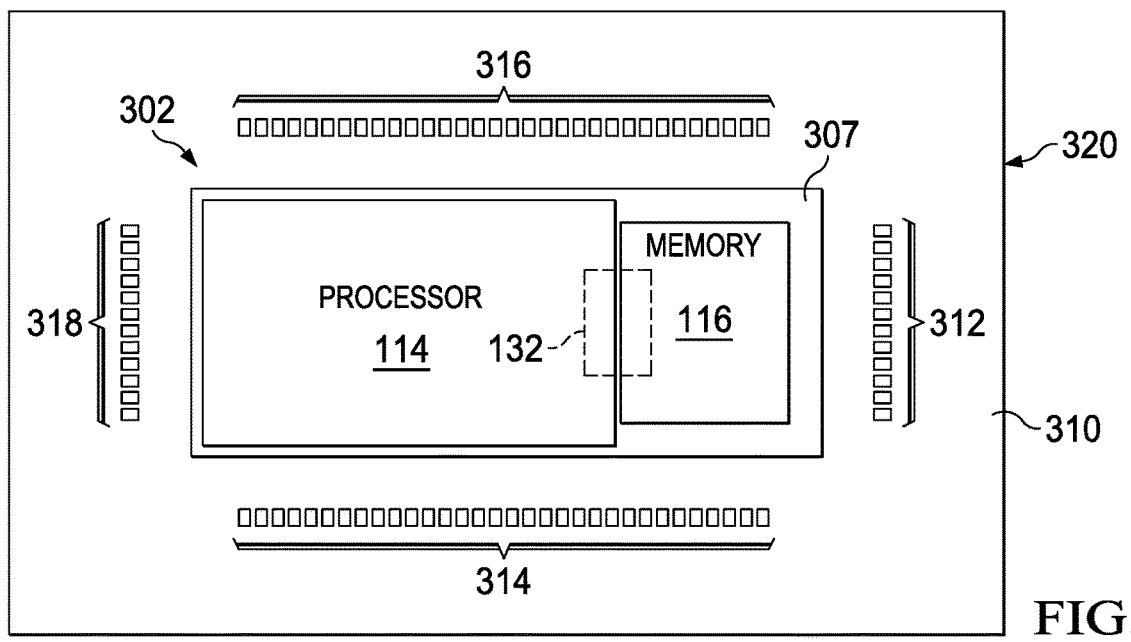
FIG. 5 illustrates a plan view of the exemplary multichip module of FIG. 3 on a substrate with discrete devices.

In some embodiments, integrated circuit die that are encapsulated together have different geometries. Referring to FIG. 3, for example, memory die 116 and processor die 114 have different geometries which results in unoccupied regions that are encapsulated using a substantial amount of mold compound 307 to form a rectangular module. In other configurations, those regions that are not occupied by functional integrated circuit die require additional mechanical support. Referring to FIG. 4, in such embodiments, one or more dummy die (e.g., dummy silicon die 402, 404, 406, and 408) are placed in those unoccupied regions and are encapsulated with processor die 114 and memory die 116 to form an encapsulated integrated circuit module. The resulting encapsulated integrated circuit module is mounted on a package substrate and discrete components are placed on the package substrate around the perimeter of the encapsulated integrated circuit module, prior to attaching a package lid to the package substrate. Referring to FIGS. 3 and 5, to accommodate those discrete components, substrate 320 has a surface area that is greater than the footprint of encapsulated integrated circuit module 302 and rows of discrete devices 312, 314, 316, and 318 are placed on package substrate 320 around encapsulated integrated circuit module 302.

Referring to FIGS. 6-11, one or more discrete devices are integrated (i.e., mechanically joined or mechanically coupled) with one or more integrated circuit die to form an encapsulated integrated circuit module that is attached to a package substrate using 3D integration techniques instead of conventional electronic packaging techniques (e.g., surface mount techniques). Integrating the discrete devices with the one or more integrated circuit die to form an encapsulated integrated circuit module uses additional conductive vias in redistribution layer 120 and, in some embodiments, uses additional conductive pillars beneath redistribution layer 120.

Figure 6:
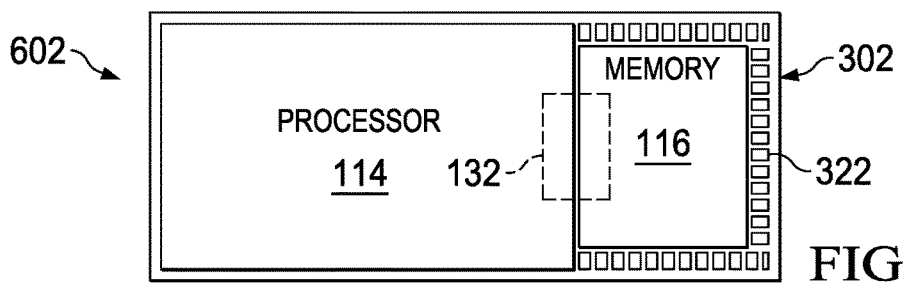
FIG. 6 illustrates a plan view of an exemplary encapsulated integrated circuit module with integrated discrete devices consistent with at least one embodiment of the invention.
Figure 7:
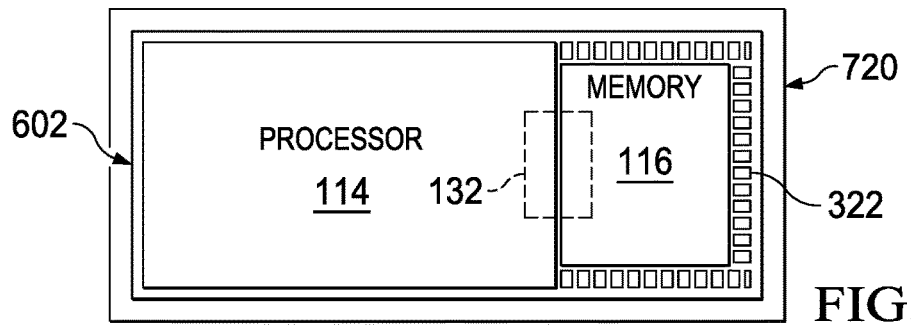
FIG. 7 illustrates a plan view of an exemplary encapsulated integrated circuit module with integrated discrete devices on a package substrate consistent with at least one embodiment of the invention.

Referring to FIGS. 6 and 7, in at least one embodiment, encapsulated integrated circuit module 602 includes discrete devices 322 surrounding memory die 116 in empty regions that would otherwise include encapsulant and dummy silicon die or only encapsulant. As a result, package substrate 720 does not include additional surface area for discrete devices and is smaller than package substrate 320 of FIG. 5, which places rows of discrete devices 312, 314, 316, and 318 on package substrate 320 around encapsulated integrated circuit module 302 of FIG. 3.

Figure 8:
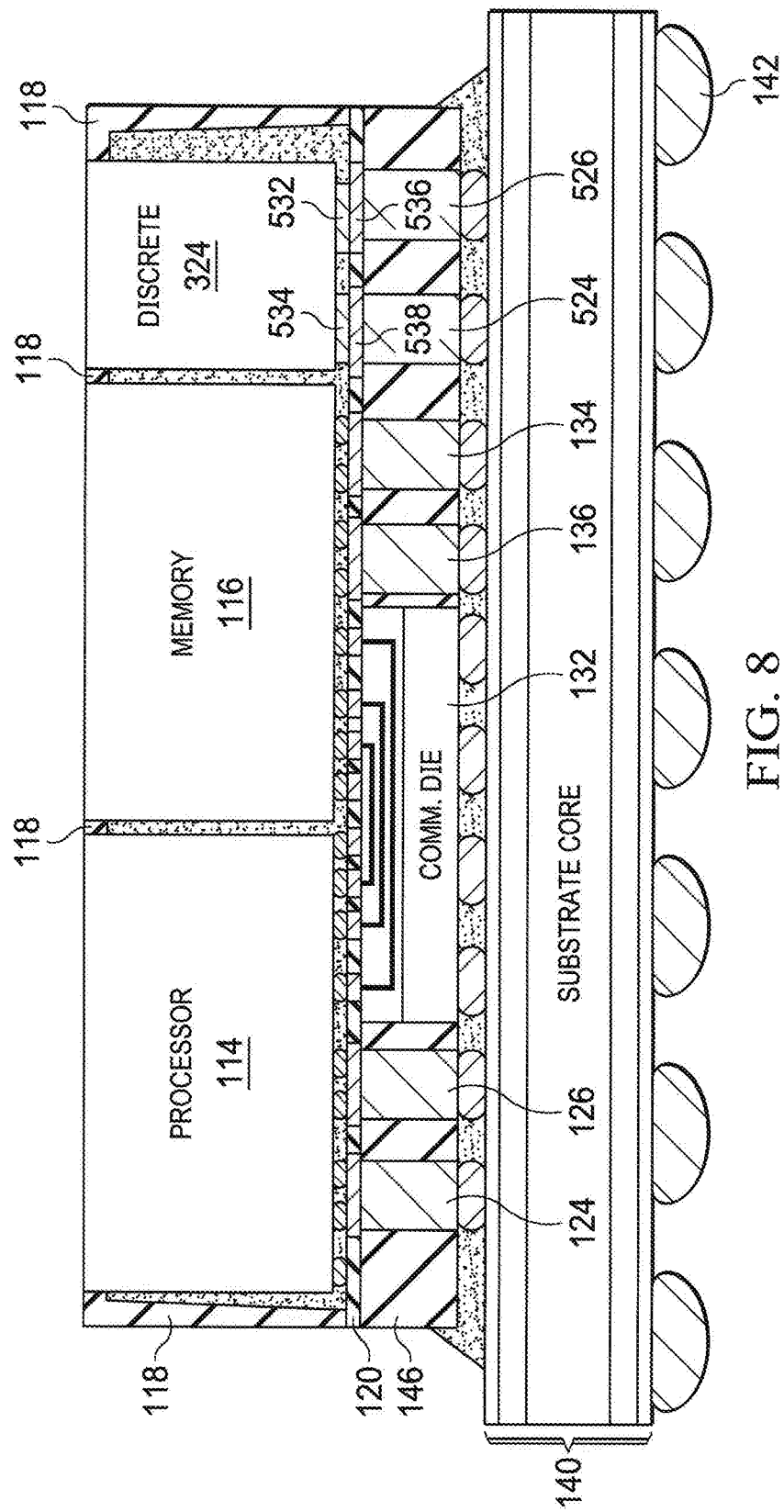
FIG. 8 illustrates a cross-sectional view of an exemplary encapsulated integrated circuit module with integrated discrete devices on a package substrate consistent with at least one embodiment of the invention.
Figure 9:
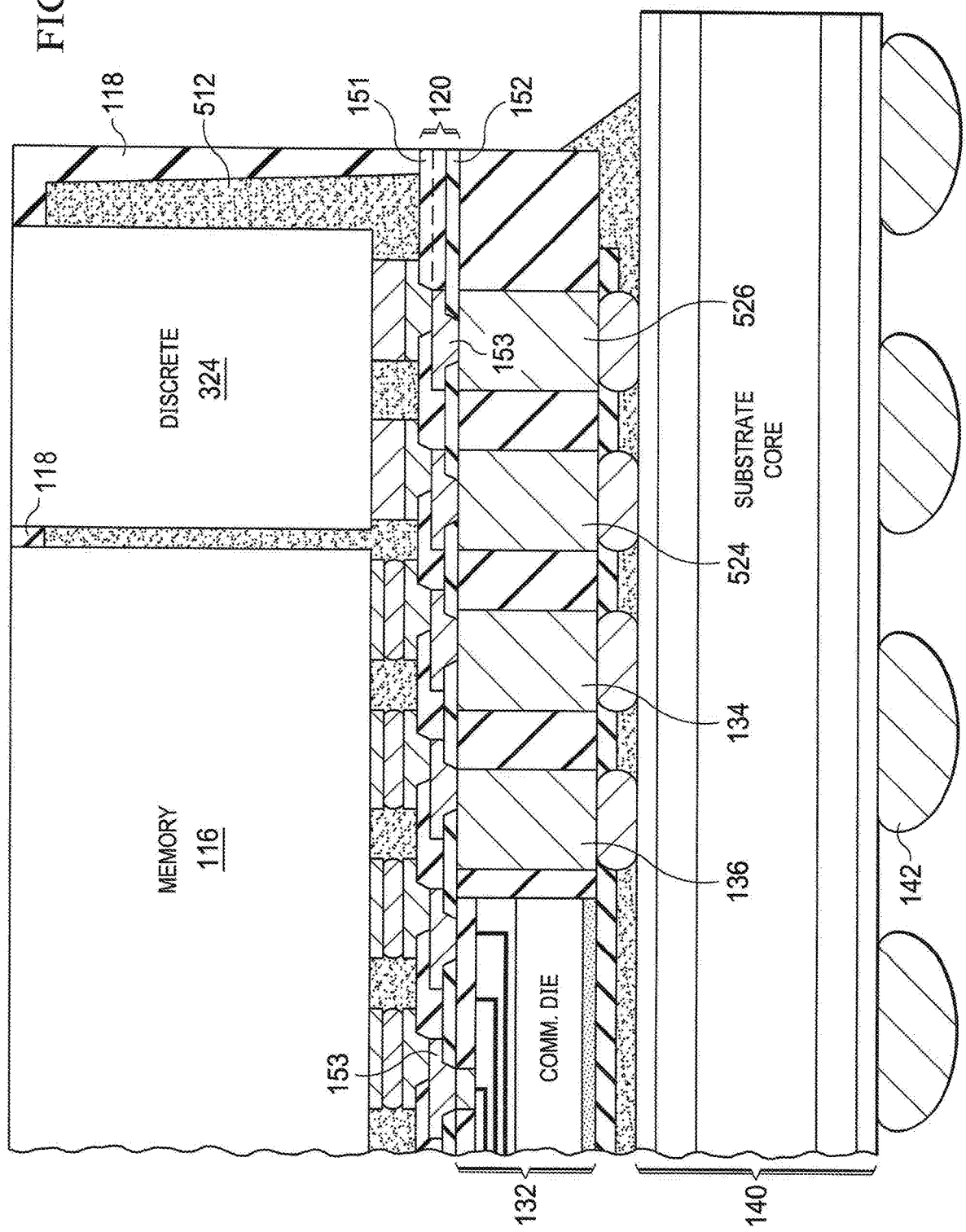
FIG. 9 illustrates a detailed view of the cross-sectional view of an exemplary encapsulated integrated circuit module with integrated discrete devices on a package substrate consistent with at least one embodiment of the invention.

FIGS. 8 and 9 illustrate cross-sectional views of an exemplary encapsulated integrated circuit module that includes discrete devices. Prior to encapsulation, discrete device 324 is placed above redistribution layer 120 using surface mount technology component placement system (i.e., pick-and-place) typically used to place surface mount devices (discrete devices or integrated circuits) onto a printed circuit board. Contacts 532 and 534 of discrete device 324 are aligned with conductive vias 536 and 538 in redistribution layer 120 that are formed using photolithography and etching techniques. Conductive vias 536 and 538 are electrically coupled to a power distribution network in substrate 140 via conductive pillars 524 and 526. Conductive pillars 524 and 526 provide a medium-low inductance connection to the power distribution network in package substrate 140 and may not be an additional cost since some packaging manufacturing processes make those conductive pillars available for parallelization to reduce inductance. In some embodiments, a discrete device shares a conductive pillar with one or more other discrete device or integrated circuit die coupled to the same electrical signal (e.g., power or ground).

In some embodiments, encapsulating discrete devices with processor die 114 and memory die 116 reduces the need for a dummy die for mechanical support, which is provided by the discrete device. Integrating discrete devices into the encapsulated integrated circuit module reduces the required size of the package substrate or facilitates increases to the area budget of the encapsulated integrated circuit module for the same size package. In addition, the discrete devices are placed closer to the integrated circuits as compared to placement of discrete devices on the periphery of the package substrate. Since redistribution layer 120 is relatively thick (e.g., 10 µm), it provides a low parasitic connection of the discrete device to either the I/Os of processor 114 or to the power distribution network enabled by redistribution layer 120. In at least one embodiment, redistribution layer 120 includes polyimide layer 151, polyimide layer 152, and copper layer 153. In some embodiments, inclusion of the discrete devices in the encapsulated integrated circuit module reduces the amount of encapsulant used, thereby reducing the risk of warpage of the encapsulated integrated circuit module. Placement of the discrete devices within the encapsulated module is subject to tighter design rules than placement of discrete devices on the package substrate, therefore tighter discrete-to-discrete spacing (e.g., approximately 80 µm-100 µm) is achievable than spacing (e.g., approximately 700 µm) achievable on a package substrate.

Figure 10:
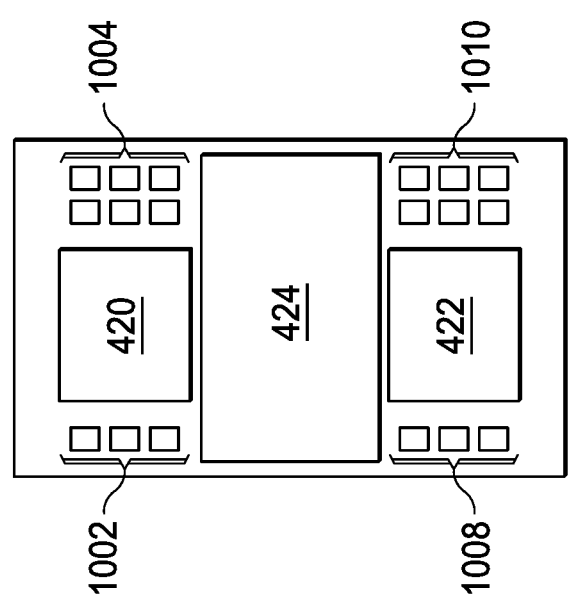
FIG. 10 illustrates a plan view of an exemplary encapsulated integrated circuit module including a processor die and multiple memory die with integrated discrete devices consistent with at least one embodiment of the invention.
Figure 12A:
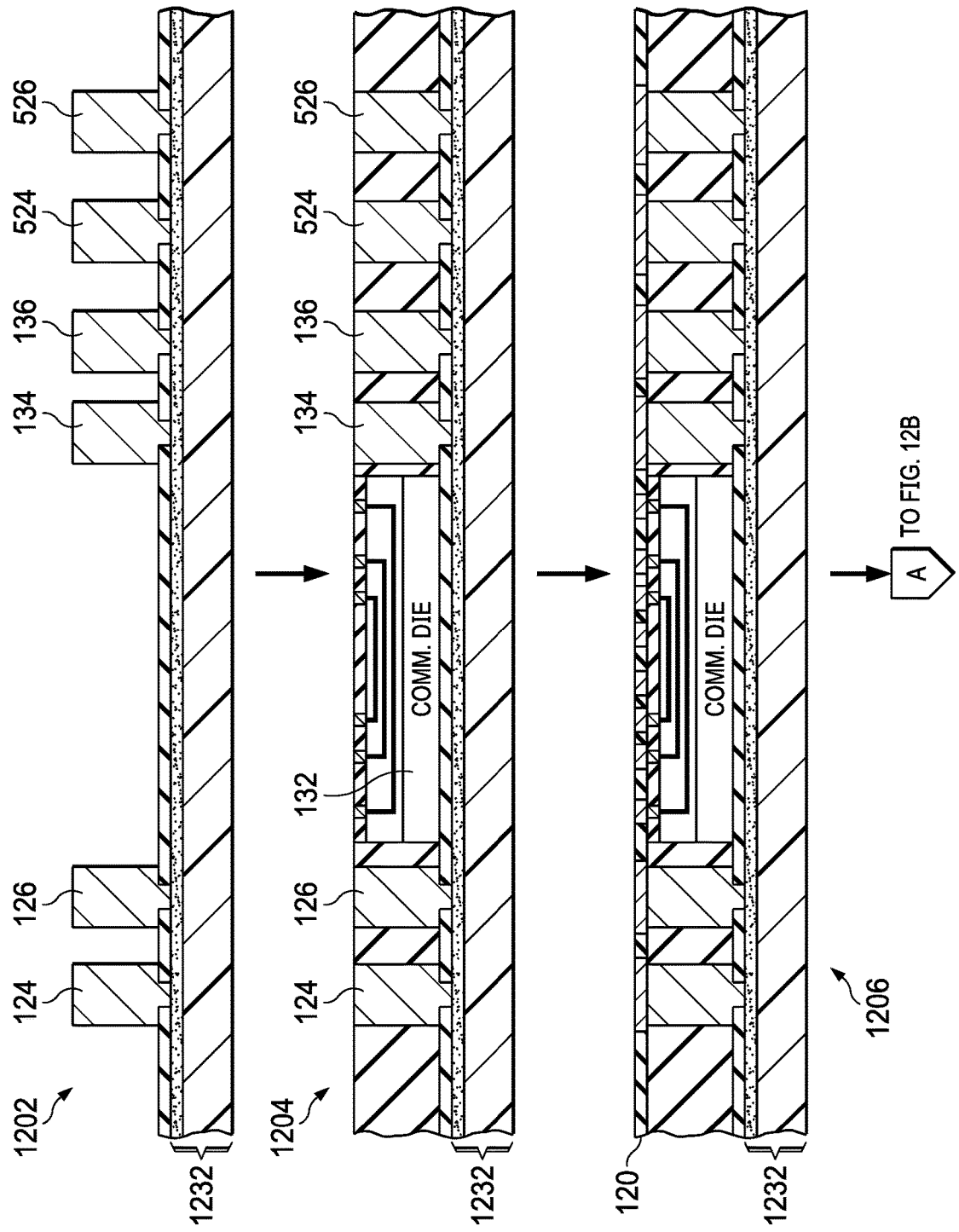
FIGS. 12A-12D illustrate an exemplary process for manufacturing an encapsulated integrated circuit module with integrated discrete devices consistent with at least one embodiment of the invention.
Figure 12B:
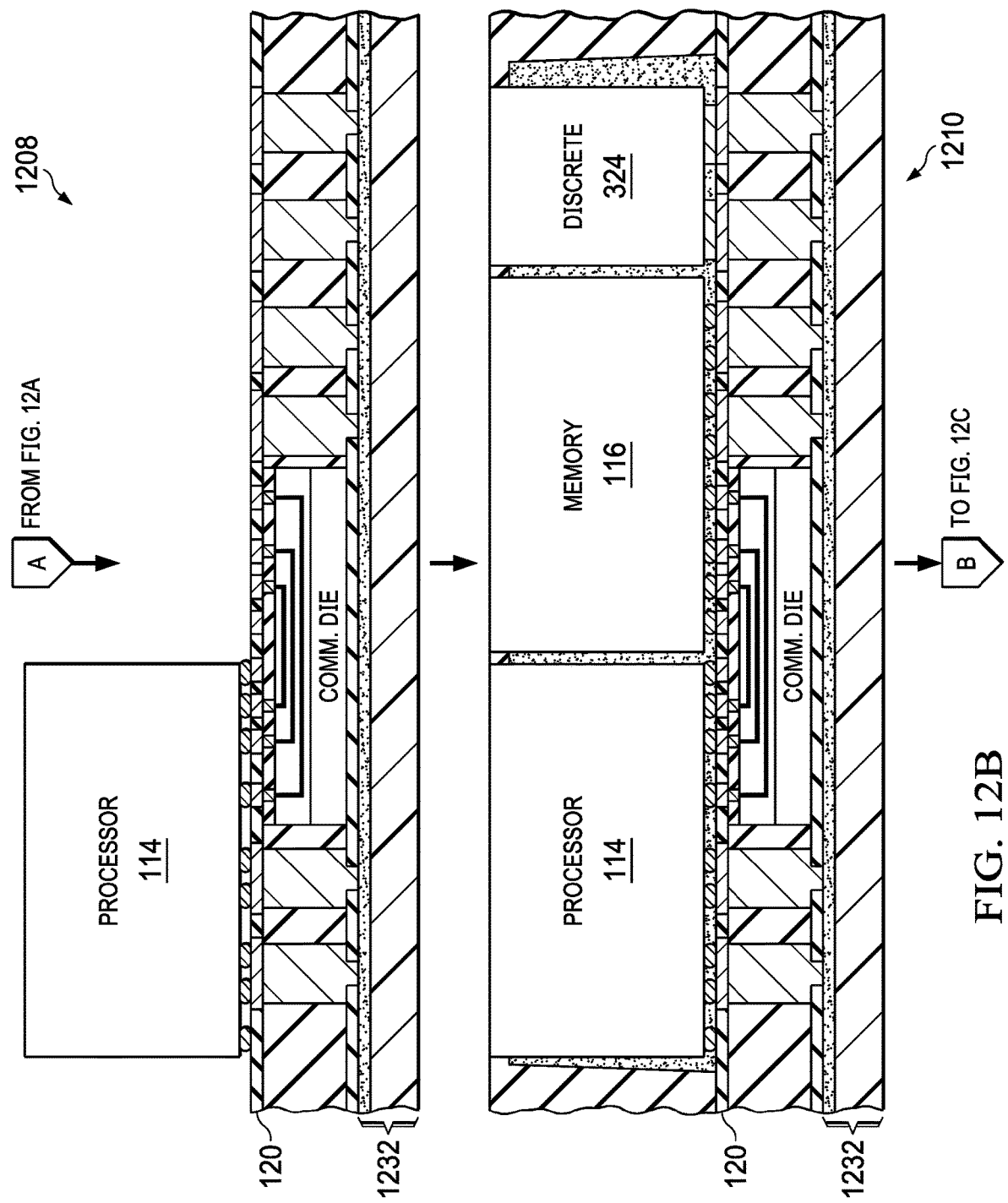
Figure 12C:
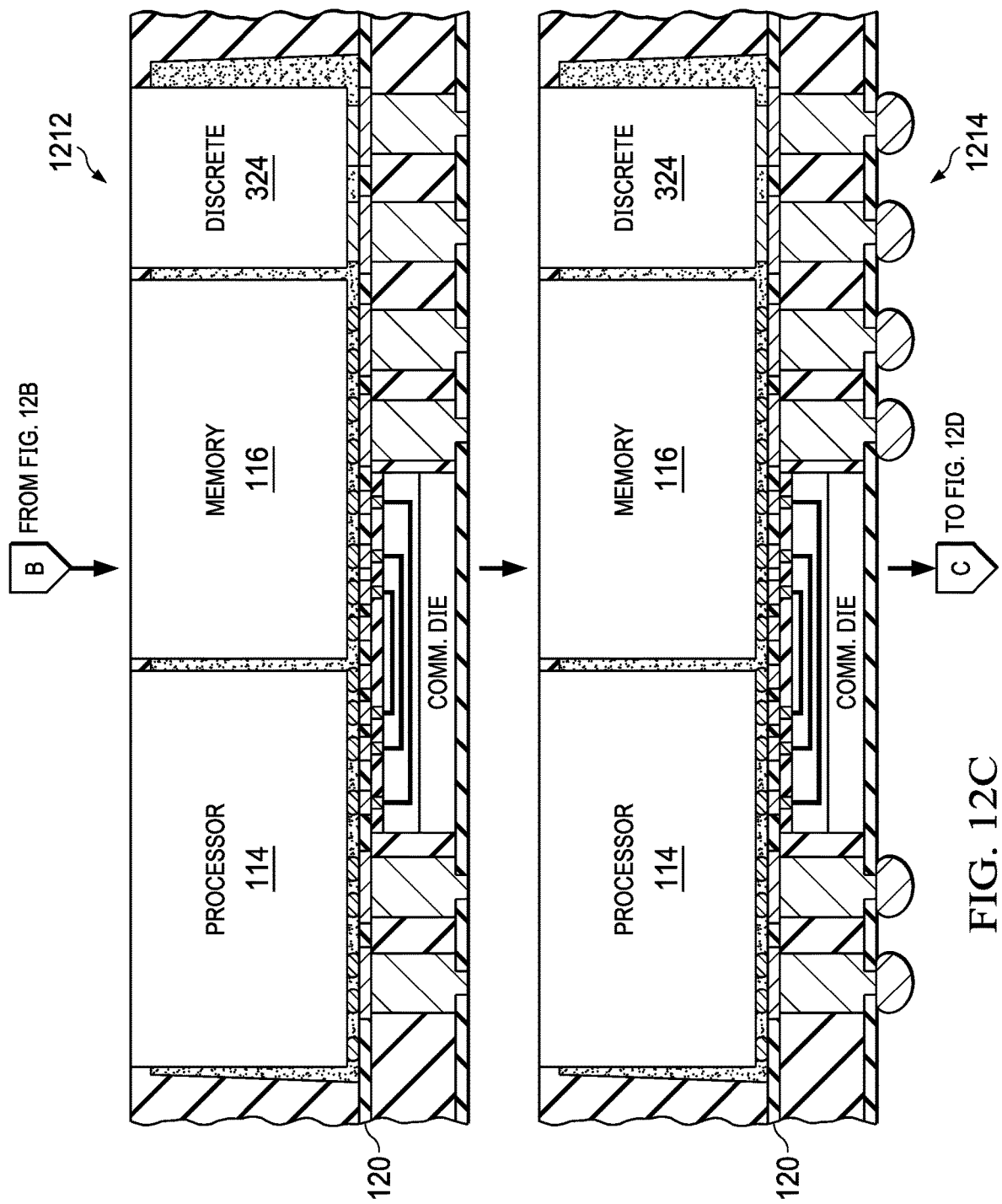
Figure 12D:
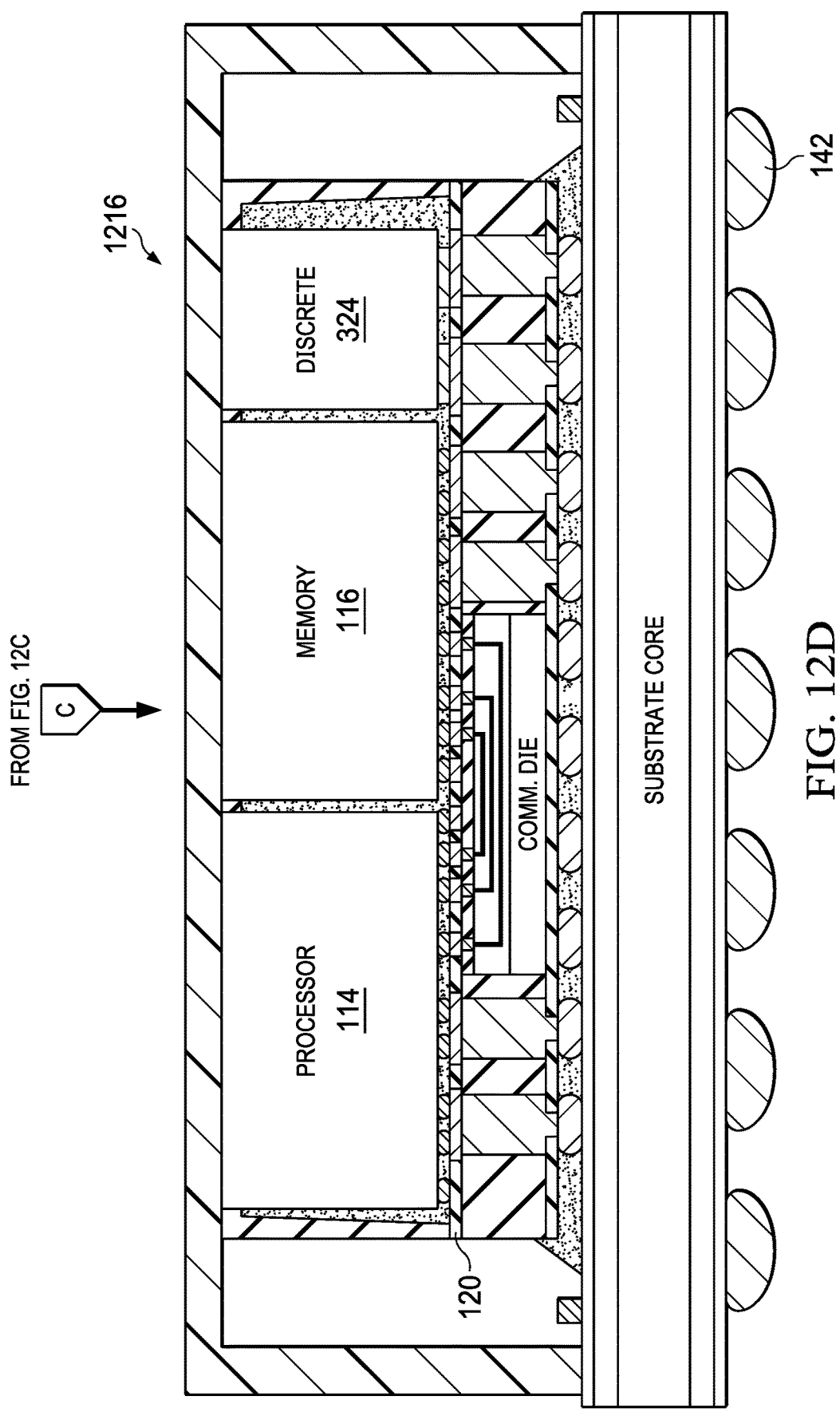

Referring to FIG. 10, in at least one embodiment, discrete devices are placed in various unused spaces formed by geometry differences between different integrated circuit die. For example, rows of discrete devices 1002, 1004, 1008, and 1010 are placed in cavities formed by differences between the geometry of memory die 420 and 422 and processor die 424 for encapsulation with those die and replace dummy die 402, 404, 406, and 408 of FIG. 4.

Figure 11:
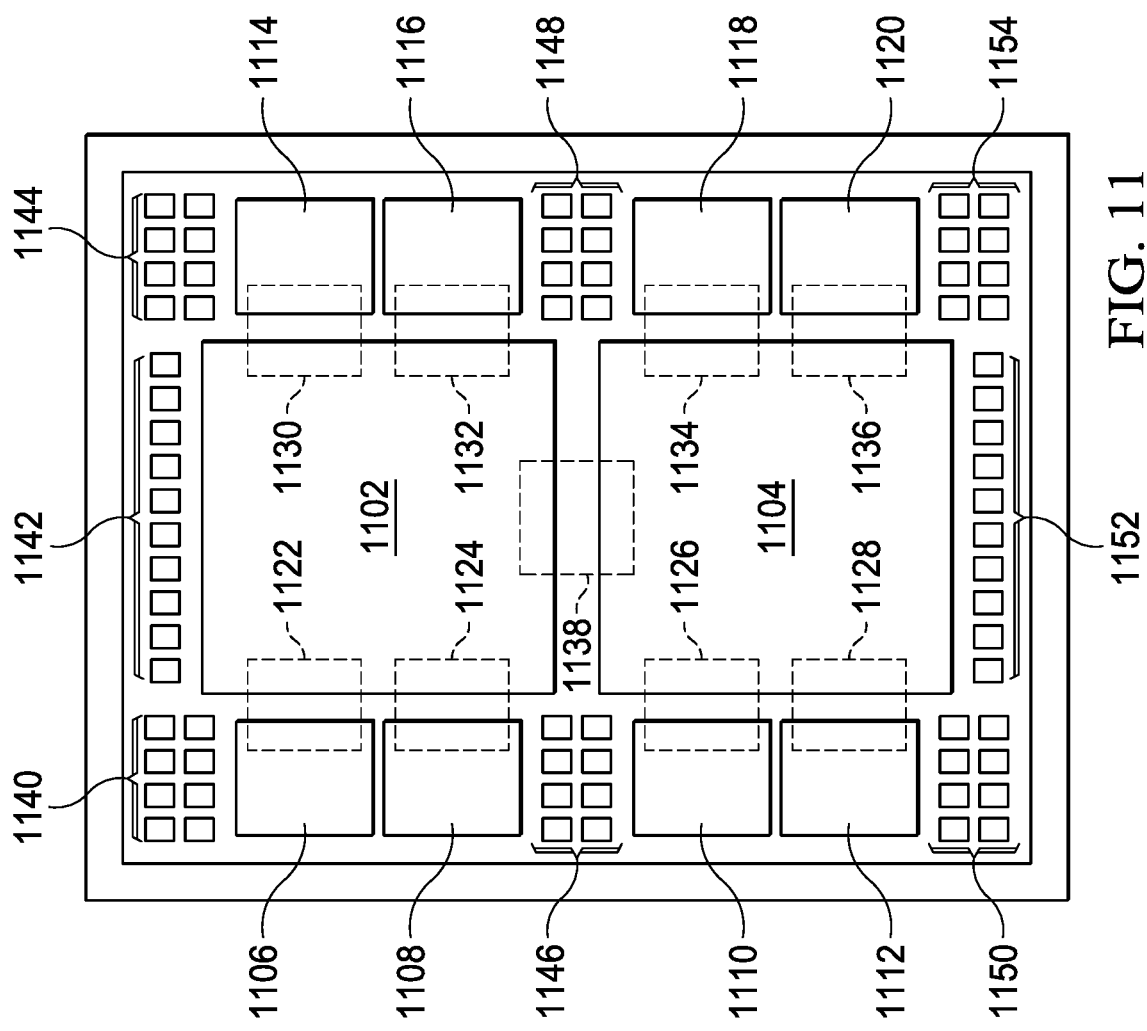
FIG. 11 illustrates a plan view of an exemplary encapsulated integrated circuit module including multiple processor die and multiple memory die with integrated discrete devices consistent with at least one embodiment of the invention.

FIG. 11 illustrates an embodiment of an encapsulated integrated circuit module including discrete devices with multiple integrated circuit die. Communications die 1122, 1124, 1126, 1128, 1130, 1132, 1134, 1136, and 1138, are disposed above a package substrate and beneath corresponding integrated circuit die. For example, communications die 1138 communicatively couples processor die 1102 and 1104. Communications die 1122, 1124, 1130, and 1132 communicatively couple memory die 1106, 1108, 1114, and 1116, respectively, to processor die 1102. Similarly, communications die 1126, 1128, 1134, and 1136 communicatively couple memory die 1110, 1112, 1118, and 1120, respectively, to processor die 1104. Rows of discrete devices 1140, 1142, 1144, 1146, 1148, 1150, 1152, and 1154 are disposed laterally (i.e., side-by-side) with respect to processor die 1102 and 1104 and memory die 1106, 1108, 1110, 1112, 1114, 1116, 1118, and 1120. Rows of discrete devices 1140, 1142, 1144, 1146, 1148, 1150, 1152, and 1154 are encapsulated with processor die 1102 and 1104 and memory die 1106, 1108, 1110, 1112, 1114, 1116, 1118, and 1120 to form an encapsulated integrated circuit module.

FIGS. 12A-12D illustrate an exemplary process for manufacturing an encapsulated integrated circuit module including discrete devices. Carrier wafer 1232 includes conductive pillars formed on electrical contacts patterned in an insulating layer above a release layer (1202). In general, a carrier wafer (e.g., glass wafer or silica wafer) provides structural support and permits safe handling of delicate semiconductor structures during manufacturing. Communications die 132 is placed in a cavity formed by conductive pillars 124, 126, 134, and 136 and attached to carrier wafer 1232 (e.g., aligned with vias in a passivation layer on carrier wafer 1232). Electrical contacts (e.g., conductive micropillars) are formed on communications die 132 prior to encapsulation. The conductive pillars and communications die 132 are mechanically joined by encapsulation using mold compound (1204). A mechanical technique (e.g., grinding) exposes the copper pillars and electrical contacts in the encapsulant before forming redistribution layer 120. Redistribution layer 120 is formed on the encapsulant and exposed conductors (1206).

Processor die 114 is placed on and attached to corresponding exposed electrical contacts (1208). In addition, memory die 116 and one or more discrete device 324 is placed on and attached to corresponding exposed electrical contacts in redistribution layer 120 using surface mount component placement techniques (e.g., pick-and-place machine). Underfill material and mold compound encapsulate processor die 114, memory die 116, and discrete devices 324 to mechanically couple them to redistribution layer 120 (1210).

Carrier wafer 1232 is removed from the resulting integrated circuit module using a mechanism associated with a corresponding bonding technique, e.g., mechanical separation, ultra-violet curing and release, heat curing and release, thermal sliding, chemical activation, laser activation, or other debonding technique associated with the material of any temporary bonding adhesive used by the carrier wafer (1212). Conductive bumps are formed on the electrical contacts exposed by the removal of carrier wafer 1232 (1214). The resulting encapsulated integrated circuit module is packaged by attaching the conductive bumps to conductive pads on a package substrate that are coupled to conductive bumps 142 and attaching a lid to the package substrate (1216).

Note that the manufacturing process of FIGS. 12A-12D is exemplary only and other sequences and types of manufacturing steps may be used to generate an integrated circuit product that has discrete devices encapsulated with integrated circuit die on a redistribution layer. For example, in other embodiments, an encapsulated integrated circuit module including discrete devices is manufactured by mounting previously manufactured (e.g., up to the point where conductive pads, passivation, and openings in the passivation exposing the conductive pads have been formed) processor die 114, memory die 116, and discrete devices on the carrier substrate using a technique described in U.S. patent application Ser. No. 15/675,214, filed Aug. 17, 2017, entitled "Molded Chip Combination," naming Milind S. Bhagavat et al. as inventors, which application is hereby incorporated by reference. Encapsulation and grinding are performed on a molded chip combination prior to separation from the carrier substrate. After applying a polymer layer and isolation film to the side of the molded chip combination including the exposed conductors and re-exposing the conductors, the redistribution layer and interconnect structures (e.g., conductive pillars and conductive micropillars) are formed (e.g., using copper or gold or combinations thereof). Communications die 132 is mounted to corresponding exposed conductors, followed by a second encapsulation and second grinding, which exposes conductive pillars, prior to forming conductive bumps. Then, the surface of the molded chip combination including the conductive bumps is attached a package substrate conductive bumps and a lid is attached to the substrate.

While the invention has been described in an embodiment in which multiple integrated circuit die are encapsulated with discrete devices and disposed above an encapsulated communications die to form an encapsulated integrated circuit module, one of skill in the art will appreciate that the teachings herein can be utilized with one integrated circuit die integrated laterally with one or more discrete device on a redistribution layer to form an encapsulated integrated circuit module with communication via the redistribution layer. In such embodiments, conductive pillars and a communications die are excluded and the redistribution layer includes conductors that couple the integrated circuit die and the discrete devices to each other and/or the power distribution network in an associated package substrate. In other embodiments, multiple integrated circuits are laid out laterally on a redistribution layer with discrete devices to form an encapsulated integrated circuit module with communication via the redistribution layer. Thus, conductive pillars and a communications die are excluded and the redistribution layer includes conductors that couple the integrated circuit die to each other and couple the discrete devices to each other and/or the power distribution network in the package substrate. Note that the use of conductive bumps are exemplary only, and in other embodiments, other interconnect structures are used.

Thus, techniques for reducing the space on a substrate for discrete components in a packaged integrated circuit module have been described. The description of the invention set forth herein is illustrative and is not intended to limit the scope of the invention as set forth in the following claims. Variations and modifications of the embodiments disclosed herein may be made based on the description set forth herein, without departing from the scope of the invention as set forth in the following claims.

What is claimed is:

1. An integrated circuit product comprising:
   a redistribution layer;

an integrated circuit die disposed above the redistribution layer;
a second integrated circuit die disposed above the redistribution layer and disposed laterally with respect to the integrated circuit die; and
a plurality of discrete devices disposed laterally with respect to the integrated circuit die and the second integrated circuit die and disposed above the redistribution layer; and
encapsulant mechanically coupling the redistribution layer, the integrated circuit die, the second integrated circuit die, and the plurality of discrete devices,
wherein the plurality of discrete devices are disposed in regions formed by differences in a first geometry of the integrated circuit die and a second geometry of the second integrated circuit die, the plurality of discrete devices being disposed in at least one row of discrete devices at least partially surrounding the second integrated circuit die.

2. The integrated circuit product, as recited in claim 1, further comprising:
first conductive vias through the redistribution layer, the first conductive vias being electrically coupled to the integrated circuit die; and
second conductive vias through the redistribution layer, the second conductive vias being electrically coupled to the plurality of discrete devices.

3. The integrated circuit product, as recited in claim 2, further comprising:
a package substrate beneath the redistribution layer,
wherein first power supply terminals of the integrated circuit die are electrically coupled to second power supply terminals of the package substrate using the first conductive vias, and
wherein third power supply terminals of the plurality of discrete devices are electrically coupled to fourth power supply terminals of the package substrate using the second conductive vias.

4. The integrated circuit product, as recited in claim 2, further comprising:
first conductive pillars electrically coupled to the first conductive vias and disposed beneath the redistribution layer;
second conductive pillars electrically coupled to the second conductive vias and disposed beneath the redistribution layer; and
third conductive pillars electrically coupled to third conductive vias and disposed beneath the redistribution layer.

5. The integrated circuit product, as recited in claim 4, further comprising:
additional encapsulant mechanically coupling the redistribution layer, the first conductive pillars, the second conductive pillars, and the third conductive pillars.

6. The integrated circuit product, as recited in claim 1, wherein the integrated circuit die includes a processor and the second integrated circuit die includes a high-bandwidth memory die.

7. The integrated circuit product, as recited in claim 1, wherein each discrete device of the plurality of discrete devices is a discrete capacitor device comprising a ceramic material.

8. An integrated circuit product comprising:
a redistribution layer;
an integrated circuit die disposed above the redistribution layer;
a discrete device disposed laterally with respect to the integrated circuit die and disposed above the redistribution layer;
first conductive vias through the redistribution layer, the first conductive vias being electrically coupled to the integrated circuit die;
second conductive vias through the redistribution layer, the second conductive vias being electrically coupled to the discrete device;
first conductive pillars electrically coupled to the first conductive vias and disposed beneath the redistribution layer;
second conductive pillars electrically coupled to the second conductive vias and disposed beneath the redistribution layer;
third conductive pillars electrically coupled to third conductive vias and disposed beneath the redistribution layer;
a second integrated circuit die disposed above the redistribution layer and laterally with respect to the integrated circuit die and the discrete device;
additional conductive vias through the redistribution layer; and
a communications integrated circuit die disposed beneath the redistribution layer, the communications integrated circuit die being electrically coupled to the integrated circuit die and the second integrated circuit die using the additional conductive vias.

9. The integrated circuit product, as recited in claim 8, further comprising:
a package substrate beneath the communications integrated circuit die, the first conductive pillars, the second conductive pillars, and the third conductive pillars,
wherein first power supply terminals of the integrated circuit die are electrically coupled to second power supply terminals of the package substrate using the first conductive pillars, third power supply terminals of the second integrated circuit die are electrically coupled to fourth power supply terminals of the package substrate using the second conductive pillars, and fifth power supply terminals of the discrete device are electrically coupled to sixth power supply terminals of the package substrate using the third conductive pillars.

10. The integrated circuit product, as recited in claim 8, wherein the discrete device includes a discrete capacitor device comprising a ceramic material.

11. The integrated circuit product, as recited in claim 8, further comprising:
encapsulant mechanically coupling the redistribution layer, the integrated circuit die, and the discrete device.

12. The integrated circuit product, as recited in claim 8, further comprising:
a plurality of discrete devices at least partially surrounding the integrated circuit die,
wherein the discrete device is included in the plurality of discrete devices, and the plurality of discrete devices are disposed in cavities formed by differences in a first geometry of the integrated circuit die and a second geometry of the second integrated circuit die, the plurality of discrete devices being disposed in at least one row of discrete devices.

13. A method for manufacturing an integrated circuit module, the method comprising:
forming a redistribution layer using a substrate;
placing an integrated circuit die on the redistribution layer;

placing a second integrated circuit die on the redistribution layer, the second integrated circuit die being disposed laterally with respect to the integrated circuit die;
placing a plurality of discrete devices on the redistribution layer, the plurality of discrete devices being disposed laterally with respect to the integrated circuit die and the second integrated circuit die; and
encapsulating the integrated circuit die, the second integrated circuit die, and the plurality of discrete devices with the redistribution layer,
wherein the plurality of discrete devices are disposed in cavities formed by differences in a first geometry of the integrated circuit die and a second geometry of the second integrated circuit die, the plurality of discrete devices being disposed in at least one row of discrete devices at least partially surrounding the second integrated circuit die.

14. The method, as recited in claim 13, further comprising:
forming first conductive vias through the redistribution layer; and
forming second conductive vias through the redistribution layer,
wherein the integrated circuit die is placed to cause the first conductive vias to be electrically coupled to the integrated circuit die, and
wherein a discrete device of the plurality of discrete devices is placed to cause the second conductive vias to be electrically coupled to the discrete device.

15. The method, as recited in claim 13, further comprising:
forming first conductive pillars using the substrate;
forming second conductive pillars using the substrate; and
forming third conductive pillars using the substrate, the redistribution layer being formed above the first conductive pillars, the second conductive pillars, and the third conductive pillars.

16. The method, as recited in claim 15, further comprising:
placing a communications integrated circuit die on the substrate, the communications integrated circuit die being disposed laterally from the first conductive pillars, the second conductive pillars, and the third conductive pillars;
forming conductors coupled to the communications integrated circuit die; and
encapsulating the communications integrated circuit die, the first conductive pillars, the second conductive pillars, the third conductive pillars, and the conductors,
wherein the redistribution layer is disposed above the communications integrated circuit die, the first conductive pillars, the second conductive pillars, the third conductive pillars, and the conductors.

17. The method, as recited in claim 16, wherein the substrate is a carrier substrate and the communications integrated circuit die, the first conductive pillars, the second conductive pillars, and the third conductive pillars are disposed between the redistribution layer and the carrier substrate, the method further comprising:
exposing the first conductive pillars, the second conductive pillars, the third conductive pillars, and the conductors prior to the forming the redistribution layer;
removing the carrier substrate to form an integrated circuit stack;
forming conductive bumps on the integrated circuit stack, the conductive bumps being electrically coupled to the first conductive pillars, the second conductive pillars, and the third conductive pillars;
attaching the conductive bumps to conductive pads on a multi-layer package substrate; and
attaching a lid to the multi-layer package substrate to package the integrated circuit module.

18. The method, as recited in claim 17, further comprising:
wherein the communications integrated circuit die is electrically coupled to the integrated circuit die and the second integrated circuit die by the conductors.

19. The method, as recited in claim 13, wherein the plurality of discrete devices includes a discrete capacitor device made from a ceramic material.

20. An integrated circuit product manufactured by the method of claim 13.

* * * * *